United States Patent [19]

Kimura

[11] Patent Number: 4,933,731
[45] Date of Patent: Jun. 12, 1990

[54] SUPERLATTICE IMAGING DEVICE

[75] Inventor: Mikihiro Kimura, Itami, Japan

[73] Assignee: Mitsubishi Denki Kabushiki Kaisha, Osaka, Japan

[21] Appl. No.: 233,592

[22] Filed: Aug. 18, 1988

[30] Foreign Application Priority Data

Aug. 27, 1987 [JP] Japan .................. 62-213301

[51] Int. Cl.$^5$ .......................... H01L 27/14
[52] U.S. Cl. ........................ 357/30; 357/4; 357/20; 357/34; 357/58
[58] Field of Search ............ 397/304, 4 SL, 58, 30 I, 397/4, 20, 34

[56] References Cited

U.S. PATENT DOCUMENTS 4,492,810 1/1985 Ovshinsky ..................... 357/2
4,714,950 12/1987 Kawajiri ....................... 357/30

FOREIGN PATENT DOCUMENTS 57-72369 5/1982 Japan ....................... 357/304

OTHER PUBLICATIONS

Esaki, L., IEEE J. of Quantum Electron., QE-22, No. 9, 9/86, 1611–1624.
L. Esaki et al., IBM J. Res. Dev., 14, (1970), pp. 61–65.
IEEE J. of Quantum Elec., QE-22, No. 9, 9/86, pp. 1853–1869.
Capasso et al., Appl. Phys. Lett., 48(7), 1986, 478–480.
Arch et al., J. Appl. Phys., 61(4), 2/15/87, pp. 1503–1509.
Dobler, IEEE J. of Quantum Electronics, QE-22, No. 9, 9/86, 1682–1695.
Reddy et al., Appl. Phys. Lett., 50(24), 6/15/87, 1748–1750.
Capasso, "Enhancement of Electron . . . ", Appl. Phy. Lett., 40(1), 1/1/82, pp. 38–40.
Cho, "Recent Advances . . . ", IEDM Tech. Dig., (1987), pp. 901–904.
Winstel and Weyrich, "Photodioden, Phototransistoren, . . . ," Optoelektronik II, 1986, pp. 232–233.
Chakrabarti and Pal, "Optical Characteristics of a Superlattice Avalanche Photodiode", Solid-State Electronics, vol. 30, No. 7, 1987, pp. 675–679.
Choi et al., "Multiquantum Well . . . ," Applied Physics Letter, Jun. 22, 1987, pp. 1814–1816.
Capasso et al., "Resonant Tunneling Through Double Barriers, Perpendicular Quantum Transport Phenomena in Superlattices, and Their Device Applications", IEEE Journal of Quantum Electronics, vol. QE-22, No. 9, Sep. 1986, pp. 1853–1869.

Primary Examiner—Andrew J. James
Assistant Examiner—David Soltz
Attorney, Agent, or Firm—Leydig, Voit & Mayer

[57] ABSTRACT

A semiconductor imaging element for generating an electrical signal representing the intensity of incident light includes an avalanche photodiode, having sequential p-type, intrinsic, and n-type layers, with a compositional superlattice as the intrinsic layer, for converting incident light to an electric signal, and a switch electrically connected to the photodiode for receiving and reading out the signal. The photodiode and switch are disposed at least partially overlying each other on the same substrate. A two-dimensional array of the imaging element can be used to generate an electrical signal representing a two-dimensional picture of a material object.

30 Claims, 7 Drawing Sheets

F I G. 1.
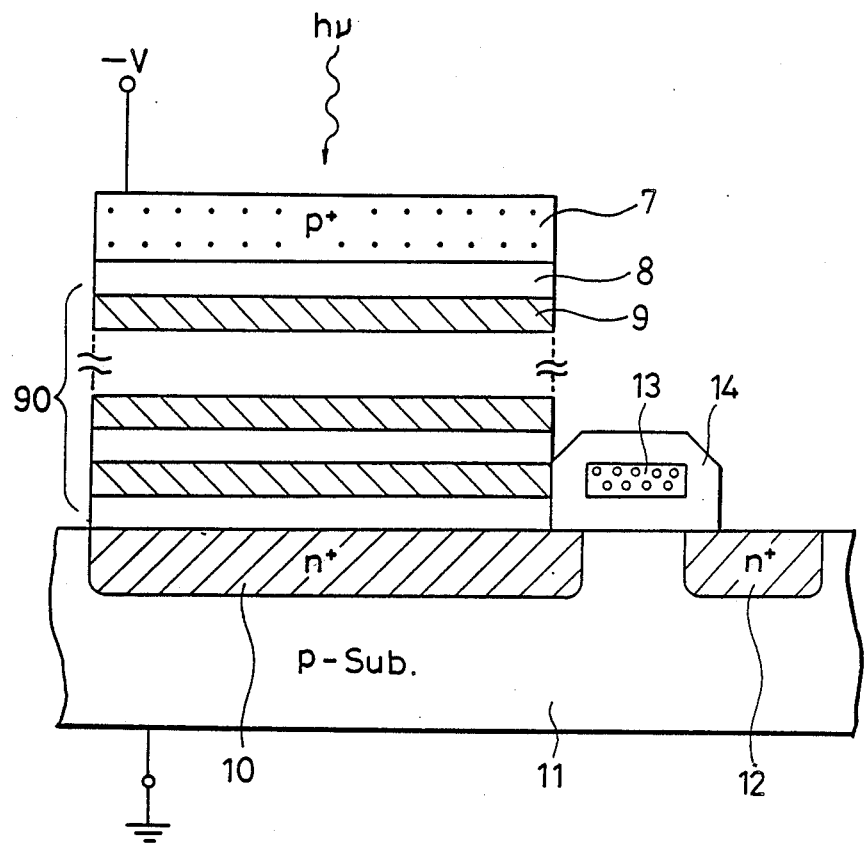

F I G .6.
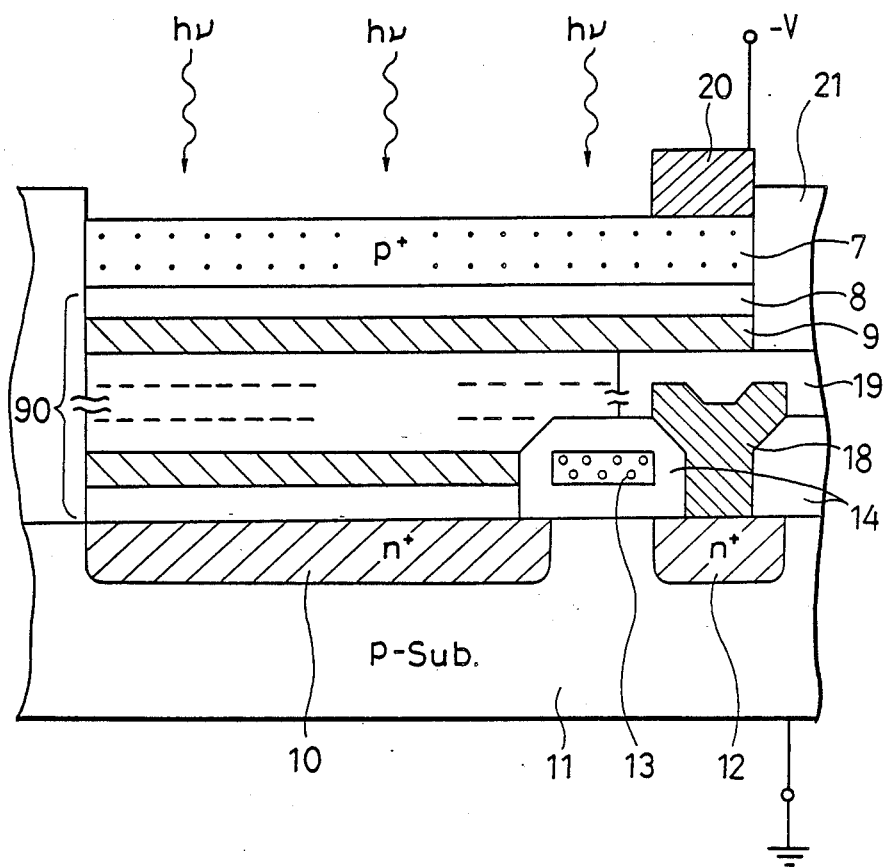

SUPERLATTICE IMAGING DEVICE

FIELD OF THE INVENTION

The present invention relates to a solid state imaging device, and more particularly to a device for converting an image of a material object into an electrical signal.

BACKGROUND OF THE INVENTION

Imaging devices, as thus broadly characterized, have been achieved in the prior art. For example, FIG. 8 shows a construction of a prior art charge coupled device (CCD) imaging element. The imaging element of FIG. 8 is based on an n-type semiconductor substrate 28, a p-type epitaxial layer 27 disposed on substrate 28, and a photodetector 23 comprising an n-type layer disposed in and at the surface of layer 27. The photodetector 23 serves to collect electrons generated in response to incident light. A CCD transfer section 26 comprises an n⁻-type layer disposed in layer 27 for receiving stored electrons from photodetector 23. A first CCD transfer gate 24 forms an embedded channel in layer 27 to read out the quantity of electrons stored at photodetector 23, and a second CCD transfer gate 25 disposed on first transfer gate 24 transfers electrons at CCD transfer section 26. In an array of these imaging elements, each element is separated from adjacent elements by an oxide film 22.

When light from an object is incident on photodetector 23, electron-hole pairs are generated. The electrons among the pairs are collected by photodetector 23, and the quantity of electrons collected corresponds to the intensity of the incident light. When a voltage is applied to control gate (first transfer gate) 24, an inversion layer (a non-equilibrium n-type layer) is produced in p-type epitaxial layer 27 opposite gate 24. The inversion layer produces a channel through which electrons may flow between the n-type layer of photodetector 23 and the n-type layer of CCD transfer section 26. The electrons collected by photodetector 23 flow into CCD transfer section 26 comprising an n⁻-type layer. Electrons that flow into CCD transfer section 26 are driven in accordance with the potential well at CCD transfer section 26. That well is produced by clock signals applied to first transfer gate 24 and to second transfer gate 25 so that the electron quantity can be read out as a signal. In an array of CCD elements lying along two transverse directions, by sequentially and repeatedly operating the CCD elements as described, it is possible to convert the light signal from an image into an electrical signal.

In the prior art system imaging device, incident light is converted to an electrical signal by a pn junction photodiode. Electrons generated by this conversion are stored for a predetermined time and thereafter are transferred to CCD transfer section 26 under the control of gate 24. Electrons that flow into CCD transfer section 26 are further transferred in response to the modulation of the potential well by clock signals applied to transfer gates 24 and 25. Thus, an electric signal corresponding to the image of a material object is obtained.

In the prior art imaging device, a photodiode for the light-to-electricity conversion and the transfer channel elements, that is, spaced apart diffused impurity regions and aligned gates, have to be constructed for each picture element on a single semiconductor substrate. As a result, the aperture ratio of the picture element (the proportion of the area occupied by the photodiode relative to the entire area of the picture element) is limited. That limitation not only limits resolution, but is also an obstacle to large scale integration of the imaging device.

Furthermore, it is impossible to improve the sensitivity of the element to incident light beyond a given threshold because the light-to-electricity conversion uses a pn junction photodiode. Moreover, the clock speed is limited because of the limited speed at which it is possible to store the light-generated electrons.

SUMMARY OF THE INVENTION

In view of the foregoing, it is a general aim of the present invention to provide a semiconductor imaging element and a device containing a plurality of such elements which is more suitable for high speed high resolution scanning than the prior art discussed above.

In that regard, it is an object of the present invention to provide an imaging element and a device comprising a matrix of such elements having an enhanced sensitivity to incident light and increased image processing speed.

According to a preferred aspect, an object of the invention is to provide an imaging device capable of achieving an aperture ratio of nearly 100%.

Other objects and advantages of the present invention will become apparent from the detailed description given herein. It should be understood, however, that the detailed description and specific embodiments are given by way of illustration only, since various changes and modifications within the spirit and scope of the invention will become apparent to those skilled in the art from the this description.

According to the present invention, a p-i-n avalanche photodiode is employed as a light-to-electricity conversion element. A compositional superlattice structure including alternating semiconductor layers having different energy band gaps is employed for the intrinsic (i) layer of the avalanche photodiode. The superlattice of the avalanche photodiode can be produced by molecular beam epitaxy (MBE). A light-to-electricity conversion element can be produced on a region of a switching transistor for processing the signal produced by the photodiode, improving the aperture ratio of the imaging element to about 100 percent. Since the light-to-electricity conversion element comprises a p-i-n avalanche photodiode, which results in a very high sensitivity, and a compositional superlattice structure is used for the i layer, which suppresses noise, i.e., dark current, the device operates at low noise as well as at high speed. The imaging device is also superior in its large scale integration capabilities.

BRIEF DESCRIPTION OF THE DRAWINGS

FIG. 1 is a cross-sectional view showing the structure of an imaging element according to an embodiment of the invention;

FIG. 6 is a cross-sectional view showing the structure of an imaging element according to another embodiment of the present invention;

DETAILED DESCRIPTION OF THE PREFERRED EMBODIMENTS

Figure 7:
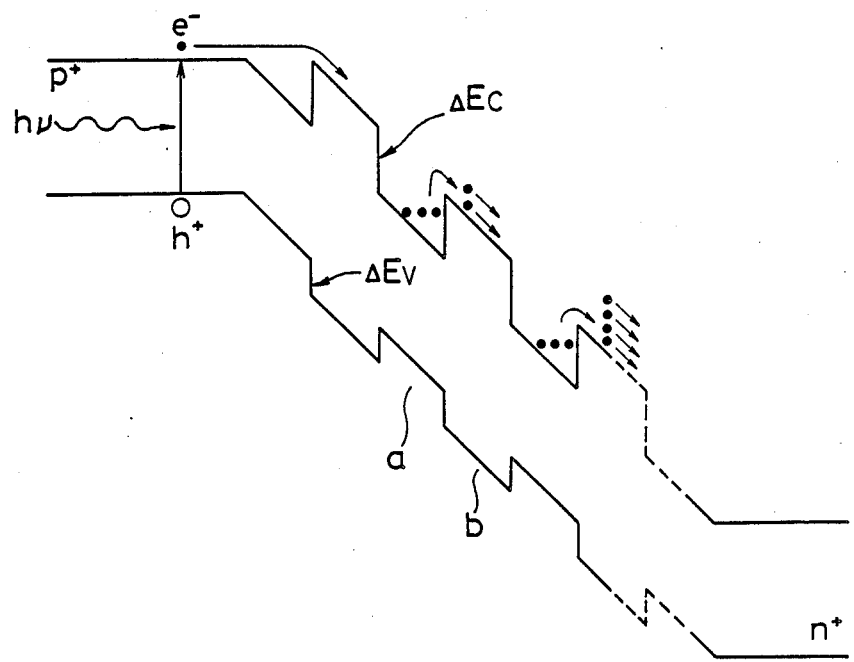
FIG. 7 is an energy band diagram illustrating the principle of operation of an avalanche photodiode incorporating a superlattice.

Before describing embodiments of the present invention, the principle of operation of an avalanche photodiode of the type employed in the invention, i.e., having a compositional superlattice structure, is described with reference to FIG. 7. FIG. 7 shows an energy band profile of a p-i-n avalanche photodiode employing a compositional superlattice structure for the i layer according to an article by Capasso et al appearing in *Applied Physics Letters,* Volume 40, No. 1, p. 38 (1982), the disclosure of which is incorporated herein by reference. Quantum well layers (a) and quantum barrier layers (b) having different energy band gaps are alternatingly disposed to produce an i layer that is interposed between $p^+$-type and $n^{30}$-type layers as a light-to-electricity conversion means. The different energy band gaps produce discontinuities in the band edges. The energy barrier discontinuity $\Delta E_c$ in the conduction band and the energy barrier discontinuity $\Delta E_v$ in the valence band have different heights with $\Delta E_c$ being greater than $\Delta E_v$.

Usually, when no bias voltage is applied, the quantum wells in the superlattice region are in a depleted state where no free electrons or free holes exist. When a voltage in excess of the avalanche turn-on voltage for a conventional p-i-n diode is applied to the superlattice photodiode, it is possible to establish a uniform electric field in the superlattice region without producing a current flow in excess of the dark current of the photodiode.

In the superlattice avalanche photodiode, a large reverse bias voltage is applied between the $p^+$-type layer and the $n^+$-type layer at the start of operation. When light is incident on the $p^+$-type layer in this state, electron-hole pairs are generated. Because of the reverse bias voltage, electrons generated by this incident light, after passing over the first superlattice quantum barrier in the i layer, reach a superlattice quantum well where they may be confined. These electrons have become hot electrons having relatively high energies due to the large electric field produced by the reverse bias voltage. The confined electrons may be ejected from a quantum well by impact ionization so that they reach the next superlattice quantum well, passing over the intervening potential barrier of the superlattice. The electrons that reach the next quantum well impact, ionize and eject electrons that are confined in that well. The ejected electrons from the second quantum well reach the next succeeding quantum well and cause ejection of the electrons confined in that well. When these ejections occur repeatedly, an avalanche phenomenon results, and a very large number of electrons are generated by the time the electron flow reaches the $n+$-type layer.

If the band structure of the superlattice is properly selected, for example, GaAs for the quantum well layers and $Al_xGa_{1-x}As$ for the quantum well barriers, the energy band discontinuities in the conduction and valence bands can be controlled. The electron ionizing coefficient $\alpha$ and the hole ionizing coefficient $\beta$ can be differentiated so that noise and dark current can be suppressed.

In accordance with the present invention, an avalanche photodiode as described generally above is utilized in an imaging element for controllably converting incident light energy into a measurable electrical signal. The avalanche photodiode has sequential p-type, intrinsic and n-type layers and includes a compositional superlattice as the intrinsic layer, thereby to achieve a low noise, light-to-electricity conversion having high sensitivity and high speed. Switching means associated with the avalanche photodiode have a first mode for collecting charge resulting from incident light energy, and a second mode for reading out the collected charge thereby to produce the measurable electrical signal which is a measure of the incident light energy. Thus, when a plurality of such imaging elements are arranged in a matrix, the switching means provides for sequential readout of plural picture elements thereby to provide an electrical measure of the visual image which had been incident on the matrix of imaging elements.

Referring to the imaging element in greater detail, FIG. 1 shows a schematic cross-sectional diagram of the structure of a superlattice imaging element according to an embodiment of the invention. That element includes a p-type semiconductor substrate 11 in which is formed an $n^+$-type charge storage region 10, preferably produced in p-type semiconductor substrate 11 by an impurity diffusion. A superlattice 90 is disposed on region 10 and includes alternating quantum well layers 8, for example, comprising GaAs, and barrier layers 9, for example, comprising $Al_xGa_{1-x}As$. A $p^+$-type layer 7, comprising a light-to-electricity conversion region, is disposed on superlattice 90. A control gate 13 is provided for reading out the quantity of charge stored in layer 10, and an $n^+$-type layer 12, preferably formed by the diffusion of impurities at the same time as $n^+$-type layer 10 is provided for forwarding electrons transmitted from layer 10. Layer 12 is disposed in and at the surface of substrate 11. In the structure of FIG. 1, the light-to-electricity conversion means comprises layer 7, superlattice 90, and layer 10. The switching means for reading out charge quantity comprises layer 10, control gate 13, and $n^+$-type layer 12. Control gate 13 is separated from substrate 11 by electrically insulating film 14. Control gate 13 and regions 10 and 12 constitute an MOSFET that is employed as a switch.

Figure 2:
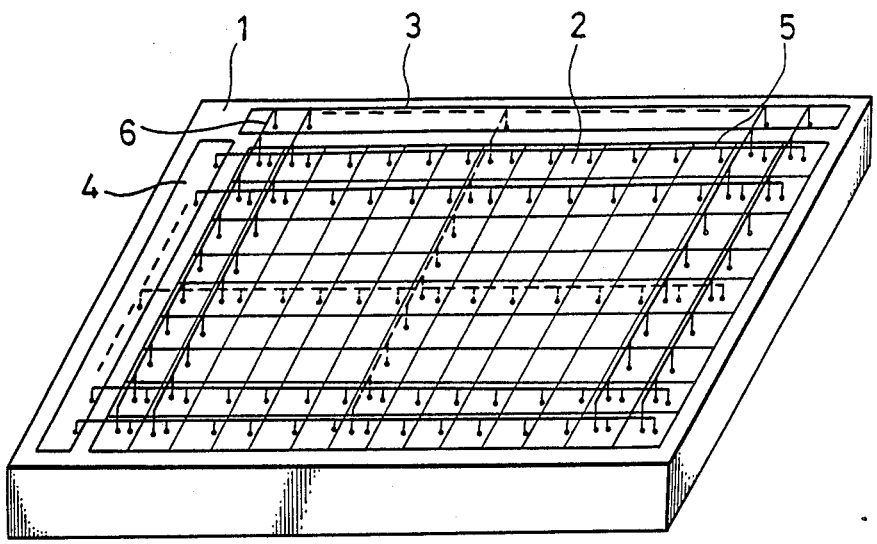
FIG. 2 is a schematic diagram showing the structure of an imaging device incorporating many elements like those of FIG. 1.

FIG. 2 schematically shows the structure of an imaging device incorporating a large number of the imaging elements of FIG. 1 in a two-dimensional array on a semiconductor chip 1. In FIG. 2, imaging elements 2 are arranged in mutually transverse directions, referred to as the horizontal direction and the vertical direction, on the surface of chip 1. A horizontal direction scanning circuit 3 and a vertical direction scanning circuit 4 are provided for reading out information from the imaging elements by successively and sequentially interrogating the elements. Horizontal direction scanning circuit 3 successively drives the imaging elements in the horizontal direction through a horizontal direction scanning line 6. Vertical direction scanning circuit 4 successively drives the imaging elements in the vertical direction through a vertical direction scanning line 5.

Figure 3:
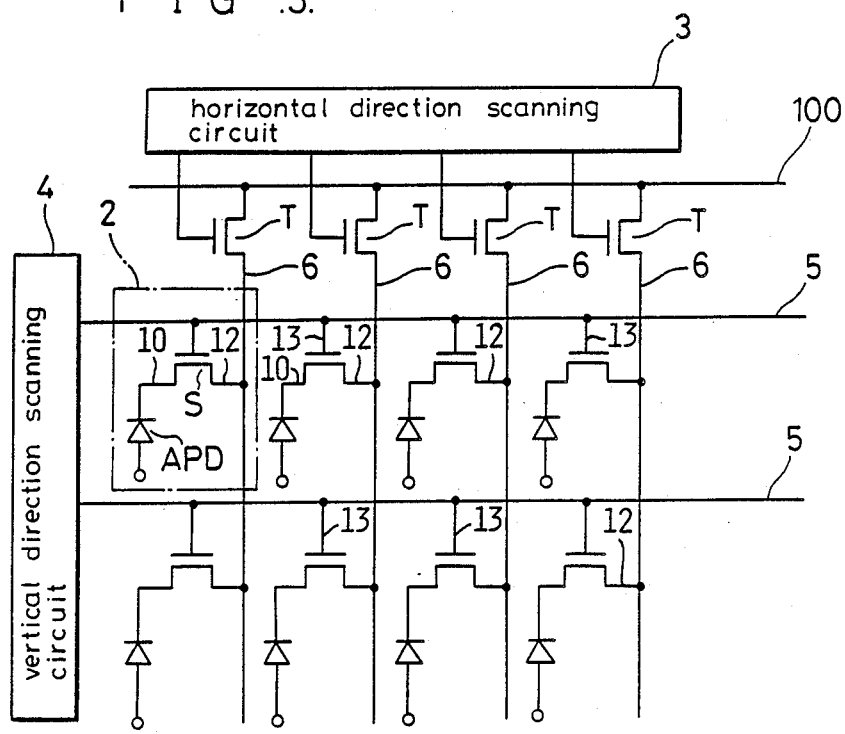
FIG. 3 is a schematic diagram showing an equivalent circuit of an array of interconnected imaging elements like those of FIG. 1.

FIG. 3 schematically shows an equivalent circuit of the structure of an imaging device according to the invention. As shown in FIG. 3, each imaging element 2 comprises an avalanche photodiode (APD) incorporating a superlattice and an MOS switch S for transmitting electrons from the avalanche photodiode to signal line 6. With reference to the structure of FIG. 1, the circuit diagram of FIG. 3 includes control gate 13 connected to vertical direction scanning line 5 and impurity diffusion layer 12 connected to horizontal direction scanning line 6. A transfer gate switch T is provided at each of horizontal scanning lines 6 for connecting the corresponding horizontal direction scanning line successively to the output signal line 100 in accordance with the control signal received from horizontal direction scanning circuit 3.

In this structure, in response to the control signal received from horizontal direction scanning circuit 3, each horizontal direction scanning line 6 is successively and sequentially connected to output signal line 100. After the scanning of an image element connected to a vertical direction scanning line 5 is completed, the next vertical direction scanning line is selected by the control signal from vertical direction scanning circuit 4. In this way, an electrical signal corresponding to an image of a material object is obtained.

Figure 4A:
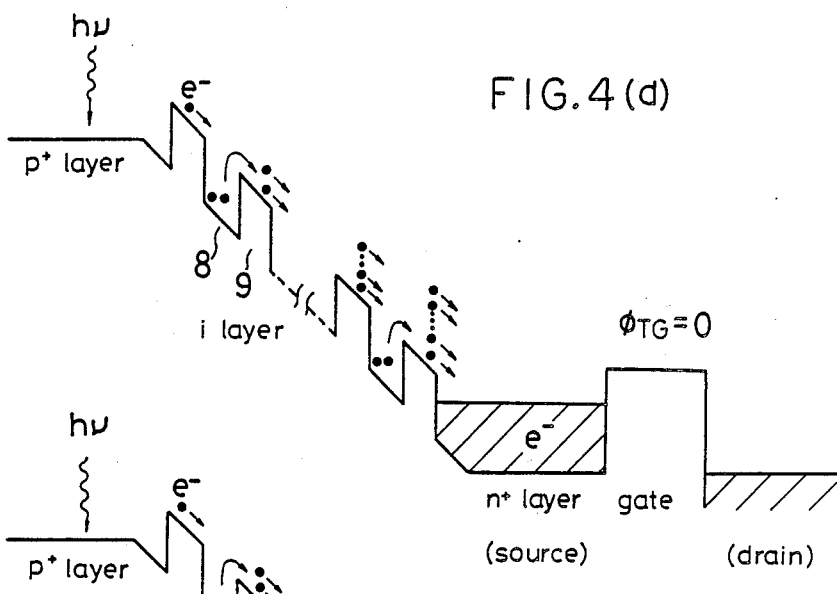
FIGS. 4(a)–4(c) are diagrams illustrating the principle of operation of a superlattice imaging element like that of FIG. 1.
Figure 4B:
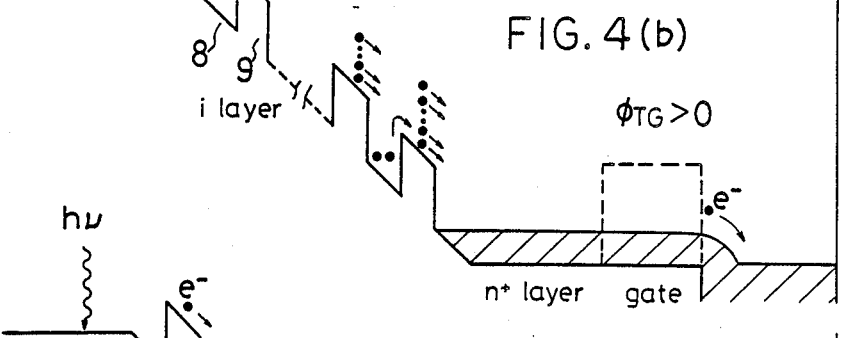
Figure 4C:
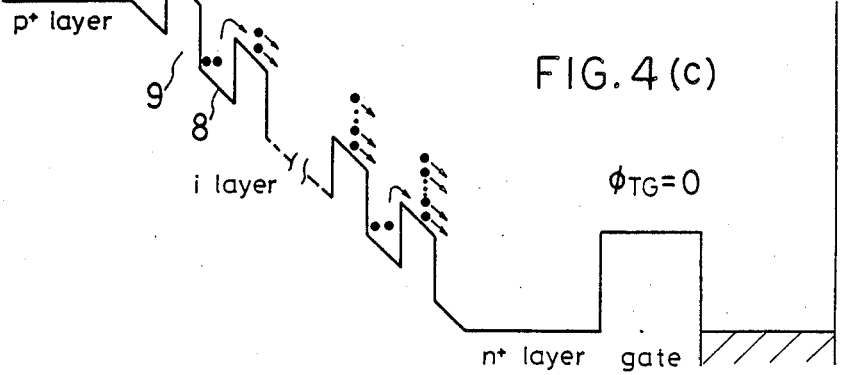

FIGS. 4(a)-4(c) show a potential profile of the conduction band of a superlattice imaging element according to an embodiment of the invention. The operation of the imaging element is described with reference to FIGS. 1 and 4(a)-4(c). Initially, a reverse bias voltage of an appropriate value is applied across layer 7 and layer 10 so that layer 7 can act as a light-to-electricity conversion means. The voltage bias produces a high electric field to induce the avalanche phenomenon in the superlattice (the i layer). A voltage $\phi_{TG}$ is applied to control gate 13 of the MOS switch. In FIG. 4(a), the $\phi_{TG}$ voltage is zero. In that case, the light-to-electricity conversion means stores charges. When light h $\nu$ is incident on layer 7, electron-hole pairs are generated and the electrons are accelerated by the electric field to reach the nearest quantum well 8 in the i layer. The electrons that reach that first quantum well eject other electrons from that well by impact ionization. Those ejected electrons reach the next quantum well after passing over the intervening quantum barrier 9. The electrons that reach the next quantum well eject more electrons from that well, again by impact ionization, causing an electron flow into the next succeeding quantum well. In accordance with the avalanche phenomenon, these repeated impact ionizations increase the quantity of electrons that flow so that a relatively large quantity of electrons are stored in layer 10, the charge storage region. Since a voltage is not applied to control gate 13, the potential of the well confining electrons in layer 10 is relatively high.

As shown in FIG. 4(b), when the imaging element is scanned and a voltage $\phi_{TG}$ greater than zero is applied to control gate 13, i.e., the gate is biased at its "high" level by the output signal of vertical scanning circuit 4, an inversion layer is generated in the substrate opposite gate 13. A channel, that is, an electron path, is produced between layers 10 and 12. Electrons stored in layer 10 flow through the channel into layer 12 where they are read out through signal line 6, transfer gate T and signal line 100, as shown in FIG. 3, under the control of horizontal direction scanning circuit 3.

Subsequently, when the voltage $\phi_{TG}$ applied to gate 13 by vertical scanning circuit 4 again becomes zero, the potential below control gate 13 rises, the electron path disappears, and layer 10 is reset as a charge storage layer. By sequentially repeating this operation at a predetermined frequency, it is possible to extract the light signal from an array of imaging elements at a predetermined rate to produce an electrical signal corresponding to the image of a material object. Since an avalanche photodiode including a superlattice is used as a light-to-electricity conversion element, it is possible to store a relatively large number of electrons in response to relative low intensity incident light. It is also possible to enhance the sensitivity of the imaging device as well as to operate the device at a high speed since the electron storage time is short.

In the described embodiment, a superlattice comprising alternating quantum well and barrier layers of GaAs and $Al_xGa_{1-x}As$ are used. However, a superlattice comprising alternating layers of indium phosphide and barrier layers of indium gallium arsenide can be used with the same effect.

While the foregoing and following discussion is particularly directed to an embodiment of the invention employing certain materials and doping relationships, the invention is not limited to those materials and relationships. For example, in FIG. 1 substrate 11 may be silicon and insulator 14 may be silicon dioxide so that the switching element is an MOSFET. In that embodiment, superlattice 90 and layer 7 may still be III-V compounds. For example, layer 7 may still be $p^+$-type GaAs and the quantum well and quantum barrier layers in superlattice 90 may be GaAs and $Al_xGa_{1-x}As$, respectively, successively grown using molecular beam epitaxy. In an alternative embodiment and in accordance with known technology, a second GaAs-based superlattice as a strained-layer superlattice (SLS) may be interposed between a silicon substrate and a GaAs-based superlattice 90 to reduce the dislocation density in superlattice 90. The intermediate superlattice may include GaAs layers to establish the quantum wells and $Al_yGa_{1-y}As$ to form the quantum barriers. That technique is described by Reddy et al. in *Applied Physics Letters*, Vol. 50, No. 24, pps. 1748-50 (1987), the disclosure of which is incorporated herein by reference.

Alternatively, layer 7 and superlattice 90 may be composed of amorphous silicon containing hydrogen, fluorine, or some other element or mixture of elements that passivate dangling bonds. In this embodiment, layer 7 may be $p^+$-type hydrogenated amorphous silicon and the quantum well layers of the superlattice may be hydrogenated amorphous silicon. The barrier layers may be hydrogenated amorphous silicon nitride or hydrogenated amorphous silicon containing a band gap altering element such as nitrogen and carbon.

In this description, emphasis is placed on employing a $p^+$-type layer as the light incident layer and employing region 10 as an $n^+$-type region. These preferred doping relationships exploit the mobility and lifetime of electrons. However, the conductivity types employed in an element device according to the invention can be reversed from those expressly described here. More particularly, and referring to FIG. 1, photodetector layer 7 would be of $n^+$-type, regions 10, 12 would be of $p^+$-type, and the substrate 11 would be an n substrate. In that reversal, the relationship of the energy band gap discontinuities, $\Delta E_c$ and $\Delta E_v$, would be reversed so that $\Delta E_v$ is greater than $\Delta E_c$. The collected and transferred charge carriers would be holes instead of electrons.

Figure 5:
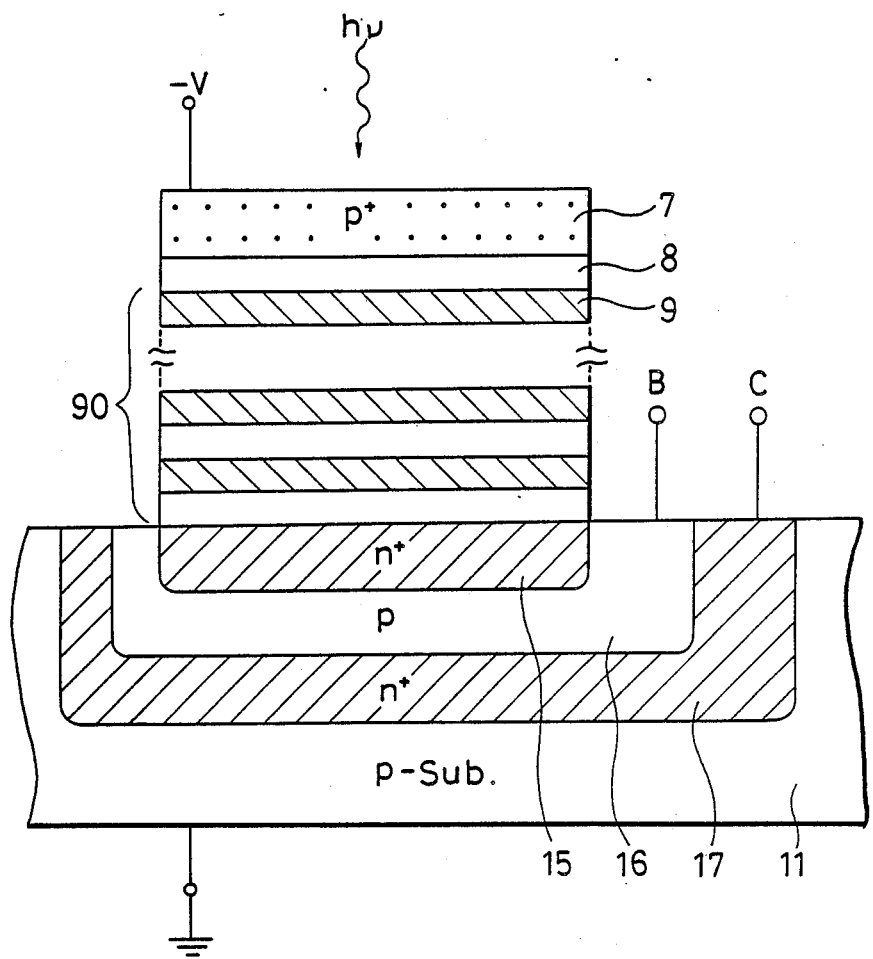
FIG. 5 is a cross-sectional view showing the structure of an imaging element according to another embodiment of the present invention.

In the imaging element shown in FIG. 1, the light-to-electricity conversion means and switching means are disposed on and are transverse to the surface of a semiconductor substrate. However, a light-to-electricity conversion element and a switching element can be produced on the same region of the surface of a substrate, thereby achieving an aperture ratio of nearly 100 percent. FIGS. 5 and 6 illustrate enhanced aperture ratio imaging elements according to the invention.

In FIG. 5, the imaging element comprises an $n^+$-type collector layer 17, preferably produced by ion implantation of impurities into substrate 11, a p-type base layer 16, preferably produced by ion implantation of impurities into collector layer 17, an $n^+$-type emitter layer 15, preferably produced by ion implantation of impurities into base layer 16. As in the prior embodiment, a superlattice 90 is produced by serially, alternatingly, disposing layers 8 and 9 having different band gaps. In the present embodiment, the superlattice 90 is formed on emitter layer 15, and a $p^+$-type region 7 as a light-to-electricity conversion means is disposed on superlattice 90. In this structure, emitter layer 15, base layer 16, and collector layer 17 constitute a bipolar transistor as a switching means for reading out information from the light-to-electricity conversion means.

In operation, electrons are stored in emitter layer 15, the electrons are transmitted to collector layer 17 in accordance with a voltage applied to base layer 16 through base electrode B. Electrons transmitted to collector layer 17 are read out from collector electrode C. Superlattice 90 comprises alternating quantum well layers 8 and quantum barrier layers 9 and is produced by using a deposition technique such as MBE. A reverse bias voltage V is applied to layer 7 to bias the light-to-electricity conversion element. In the structure shown in FIG. 5, the avalanche photodiode and the switching element overly the same region of the imaging element. As a result, the imaging element aperture ratio approaches 100 percent.

FIG. 6 is a cross-sectional view showing another structure of a superlattice imaging element according to an embodiment of the invention. In the structure of FIG. 6, the switching transistor for reading out information comprises an MOSFET or an MESFET. Parts of layer 7 and of quantum well layers 8 and quantum barrier layers 9 overly the switching transistor. In this construction, the transistor comprises control gate 13, $n^+$-type layer 10, preferably formed by diffusion of impurities, and $n^+$-type 12, also preferably formed in a diffusion step. Electrons produced by the light-to-electricity conversion element are read out through layer 12 and a signal line 18. Signal line 18 and control gate 13 are separated by an insulating film 14. Signal line 18 and superlattice 90 are separated by a second insulating film 19, such as silicon dioxide, silicon nitride, or a glass. Superlattice 90 and layer 7 are both at least partially disposed on insulating film 19 and are separated from adjacent imaging elements by an insulating separation film 21. Film 21 may be one of the same insulators from which film 19 is chosen. An electrode 20 for applying a reverse bias voltage to layer 7 is disposed on a portion of layer 7. The depicted structure produces an aperture ratio of approximately 100 percent and is capable of large scale integration in a complex imaging device.

In the structure of FIG. 6, the imaging element is isolated from adjacent imaging elements by an insulating film 21, but the desired isolation can also be achieved by using an air gap between adjacent elements instead of an insulating film. In the illustrated embodiment, a metallic electrode is provided at the surface of layer 7 in order to apply a bias voltage to the light-to-electricity conversion means. The metallic electrode can be supplemented with or replaced by a transparent electrode, for example, an electrode made from a transparent, electrically conductive oxide such as indium tin oxide.

Figure 8:
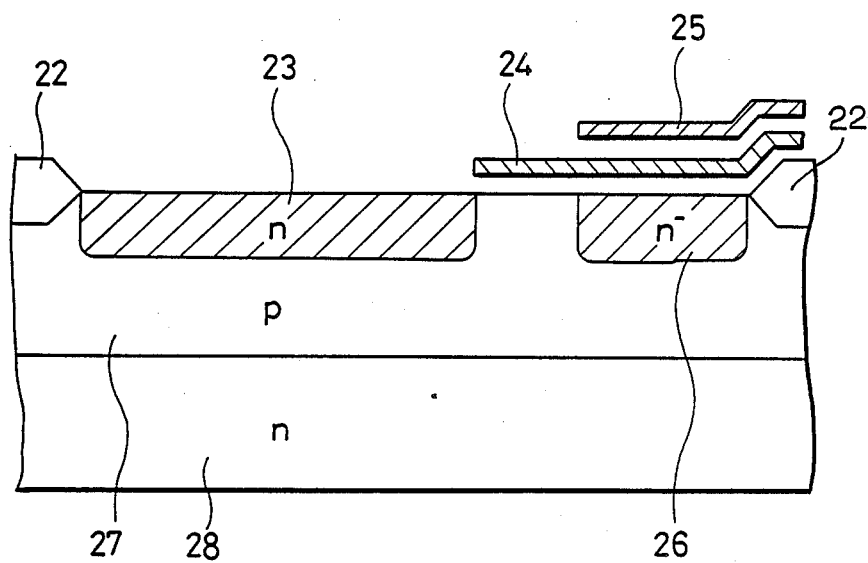
FIG. 8 is a schematic diagram of the structure of a prior art imaging element.

In the described embodiments, an MOSFET, MESFET, or a bipolar transistor is used as a switching means for reading out information. However, the signal extraction means may comprise a CCD structure employing a buried channel as described in connection with FIG. 8. Of course, the present invention may also be applied to an imaging device of another construction, achieving the same advantages already described.

In the described embodiments, the imaging element including an avalanche photodiode using photogenerated electron injection is described. In addition, an avalanche photodiode utilizing hot electron injection can also be used to achieve large scale integration of imaging elements capable of high speed operation at low noise.

What is claimed is:

1. A semiconductor imaging element for generating an electric signal representing the intensity of incident light comprising:
   a semiconductor substrate;
   an avalanche photodiode, having sequential p-type, intrinsic, and n-type layers, and including a compositional superlattice as said intrinsic layer, one of the p-type or n-type layers being oriented to receive incident light and produce photocarriers in response thereto, the compositional superlattice being disposed to receive said photocarriers and by impact ionization to create and convey a larger number of carriers to the other of said p-type or n-type layers, thereby to convert incident light to an amplified electrical signal; and
   switching means electrically connected to said photodiode for receiving and reading out said signal.

2. The imaging element of claim 1 wherein said photodiode at least partially overlies said switching means on said substrate.

3. The imaging element of claim 1 wherein said switching means is a transistor formed at least partly in said substrate.

4. The imaging element of claim 3 wherein said transistor is one of the group consisting of MOSFET, MESFET, and bipolar transistors.

5. The imaging element of claim 1 wherein said switching means comprises a charge coupled device.

6. The imaging element of claim 1 wherein said substrate is silicon and said superlattice includes alternating layers of GaAs and $Al_xGa_{1-x}As$.

7. The imaging element of claim 6 including a second compositional superlattice disposed between said intrinsic layer and said substrate as a distortion-relieving layer.

8. The imaging element of claim 7 wherein said second superlattice includes alternating layers of GaAs and $Al_yGa_{1-y}As$.

9. The imaging element of claim 1 wherein said superlattice includes alternating layers of hydrogenated amorphous silicon and hydrogenated amorphous silicon containing a band gap modifying agent chosen from the group consisting of nitrogen and carbon.

10. The imaging element of claim 1 wherein said substrate is GaAs and said superlattice includes alternating layers of GaAs and $Al_xGa_{1-x}As$.

11. The imaging element of claim 2 wherein said p-type layer of said photodiode is disposed for receiving light and said n-type layer of said photodiode also forms an active region of said switching means.

12. The imaging element of claim 2 wherein said n-type layer of said photodiode is a first n-type region formed in the substrate, said substrate being p-type, said p-type layer of said photodiode being oriented to receive the incident light, said switching means comprising said first n-type region as an electrode of a field effect transistor, a second n-type region in said substrate as a second electrode, and a gate disposed between said first and second n-type regions for establishing a path for the flow of electrons between said first and second n-type regions, and said p-type layer of said photodiode being positioned to substantially overlie said field effect transistor in such a way as to provide an aperture ratio approaching 100 percent.

13. The imaging element of claim 2 wherein said n-type layer of said photodiode is a first n-type region formed in the substrate, said substrate being p-type, and said switching means comprises said n-type region as the emitter of a bipolar transistor and including a p-type base formed in said substrate surrounding said emitter, and an n-type collector formed in said substrate surrounding said base.

14. The imaging element of claim 1 including a transparent, electrically conductive electrode disposed on said photodiode for transmitting incident light and for applying a voltage bias to said photodiode.

15. The imaging element of claim 1 including a metallic electrode disposed on a portion of said photodiode that receives incident light for applying a voltage bias to said photodiode.

16. A semiconductor imaging device for generating an electrical signal representing a two-dimensional picture of a material object comprising:
a common substrate;
a two-dimensional array of a plurality of imaging elements, each imaging element including an avalanche photodiode, having sequential p-type, intrinsic, and n-type layers and including a compositional superlattice as said intrinsic layer, one of the p-type or n-type layers being oriented to receive incident light and produce photocarriers in response thereto, the compositional superlattice being disposed to receive said photocarriers and by impact ionization to create and convey a larger number of carriers to the other of said p-type or n-type layers, thereby to convert incident light to an amplified electrical signal; and
switching means electrically connected to a said photodiode for receiving and reading out said signal.

17. The imaging device of claim 16 wherein each said photodiode at least partially overlies said respective switching means on said common substrate.

18. The imaging device of claim 16 wherein at least one of said switching means is a transistor formed at least partly in said common substrate.

19. The imaging device of claim 18 wherein said transistor is one of the group consisting of MOSFET, MESFET, and bipolar transistors.

20. The imaging device of claim 16 wherein at least one of said switching means comprises a charge coupled device.

21. The imaging device of claim 16 wherein said common substrate is silicon and at least one of said superlattices includes alternating layers of GaAs and $Al_xGa_{1-x}As$.

22. The imaging device of claim 21 wherein at least one of said imaging elements includes a second compositional superlattice disposed between said intrinsic layer of said photodiode and said substrate as a distortion-relieving layer.

23. The imaging device of claim 22 wherein said second superlattice includes alternating layers of GaAs and $Al_yGa_{1-y}As$.

24. The imaging device of claim 16 wherein said substrate is silicon and at least one of said superlattices includes alternating layers of hydrogenated amorphous silicon and hydrogenated amorphous silicon containing a band gap modifying agent chosen from the group consisting of nitrogen and carbon.

25. The imaging device of claim 16 wherein said substrate is GaAs and at least one of said superlattices includes alternating layers of GaAs and $Al_xGa_{1-x}As$.

26. The imaging device of claim 17 wherein the p-type layers of said photodiodes are disposed for receiving light and said n-type layers of said photodiodes form active regions in said substrate of said respective switching means.

27. The imaging device of claim 17 wherein said n-type layer of each of said photodiodes is formed as a first n-type region in the substrate, said substrate being p-type, said p-type layer of said photodiode being oriented to receive the incident light, and each of said respective switching means comprising said respective first n-type region as an electrode of a field effect transistor, a second n-type region in said substrate as a second electrode, and a gate disposed between said first and second regions for establishing a path for the flow of electrons between said first and second n-type regions, and said p-type layer of said photodiode being positioned to substantially overlie said field effect transistor in such a way as to provide an aperture ratio approaching 100 percent.

28. The imaging device of claim 17 wherein said n-type layer of said photodiode is a first n-type region formed in the substrate, said substrate being p-type, and said switching means comprises said respective n-type region as the emitter of a bipolar transistor and including a p-type base in said substrate surrounding said emitter, and an n-type collector in said substrate surrounding said base.

29. The imaging device of claim 16 wherein said imaging elements are mutually isolated from each other by air gaps.

30. The imaging device of claim 16 wherein said imaging elements are isolated from each other by at least one electrically insulating film.

* * * * *